United States Patent
Brosh

(10) Patent No.: US 9,487,388 B2
(45) Date of Patent: Nov. 8, 2016

(54) RUGGEDIZED MEMS FORCE DIE

(71) Applicant: NextInput, Inc., Atlanta, GA (US)

(72) Inventor: Amnon Brosh, Santa Monica, CA (US)

(73) Assignee: NextInput, Inc., San Jose, CA (US)

( * ) Notice: Subject to any disclaimer, the term of this patent is extended or adjusted under 35 U.S.C. 154(b) by 0 days.

(21) Appl. No.: 13/923,998

(22) Filed: Jun. 21, 2013

(65) Prior Publication Data

US 2013/0341741 A1    Dec. 26, 2013

Related U.S. Application Data

(60) Provisional application No. 61/690,161, filed on Jun. 21, 2012.

(51) Int. Cl.
| | | |
|---|---|---|
| *H01L 21/306* | (2006.01) | |
| *B81B 3/00* | (2006.01) | |
| *B81C 1/00* | (2006.01) | |
| *G01L 1/04* | (2006.01) | |
| *G01L 1/18* | (2006.01) | |
| *G01L 5/00* | (2006.01) | |
| *G01L 5/16* | (2006.01) | |

(52) U.S. Cl.
CPC ............ *B81B 3/0072* (2013.01); *B81B 3/0021* (2013.01); *B81C 1/00158* (2013.01); *B81C 1/00666* (2013.01); *G01L 1/044* (2013.01); *G01L 1/18* (2013.01); *G01L 5/0028* (2013.01); *G01L 5/0057* (2013.01); *G01L 5/162* (2013.01)

(58) Field of Classification Search
CPC ....................................................... H01L 21/306
USPC ......................................................... 257/415
See application file for complete search history.

(56) References Cited

U.S. PATENT DOCUMENTS

| | | | |
|---|---|---|---|
| 4,814,856 A | 3/1989 | Kurtz et al. | |
| 4,914,624 A | 4/1990 | Dunthorn | |
| 4,918,262 A | 4/1990 | Flowers et al. | |
| 4,933,660 A | 6/1990 | Wynne | |
| 4,983,786 A | 1/1991 | Stevens | |
| 5,159,159 A | 10/1992 | Asher | |
| 5,237,879 A | 8/1993 | Speeter | |
| 5,320,705 A | 6/1994 | Fujii et al. | |
| 5,333,505 A * | 8/1994 | Takahashi et al. | 73/727 |
| 5,343,220 A | 8/1994 | Veasy et al. | |

(Continued)

FOREIGN PATENT DOCUMENTS

| | | |
|---|---|---|
| DE | 102010012441 | 9/2011 |
| JP | 2004156937 | 6/2004 |

(Continued)

OTHER PUBLICATIONS

Nesterov et al., Modelling and investigation of the silicon twin design 3D micro probe, 2005, Institute of Physics Publishing, Journal of Micromechanics and Microengeneering, 15, 514-520.*

(Continued)

*Primary Examiner* — Kenneth Parker
*Assistant Examiner* — Christopher Culbert
(74) *Attorney, Agent, or Firm* — Meunier Carlin & Curfman LLC

(57) ABSTRACT

Described herein are ruggedized wafer level MEMS force dies composed of a platform and a silicon sensor. The silicon sensor employs multiple flexible sensing elements containing Piezoresistive strain gages and wire bonds.

18 Claims, 2 Drawing Sheets

(56) References Cited

U.S. PATENT DOCUMENTS

| | | |
|---|---|---|
| 5,349,746 A | 9/1994 | Gruenwald et al. |
| 5,351,550 A | 10/1994 | Maurer |
| 5,483,994 A | 1/1996 | Maurer |
| 5,510,812 A | 4/1996 | O'Mara et al. |
| 5,541,372 A | 7/1996 | Baller et al. |
| 5,543,591 A | 8/1996 | Gillespie et al. |
| 5,565,657 A | 10/1996 | Merz |
| 5,600,074 A * | 2/1997 | Marek et al. ............ 73/862.625 |
| 5,673,066 A | 9/1997 | Toda et al. |
| 5,889,236 A | 3/1999 | Gillespie et al. |
| 5,921,896 A | 7/1999 | Boland |
| 6,028,271 A | 2/2000 | Gillespie et al. |
| 6,159,166 A | 12/2000 | Chesney et al. |
| 6,243,075 B1 | 6/2001 | Fishkin et al. |
| 6,348,663 B1 | 2/2002 | Schoos et al. |
| 6,351,205 B1 | 2/2002 | Armstrong |
| 6,360,598 B1 | 3/2002 | Calame et al. |
| 6,437,682 B1 | 8/2002 | Vance |
| 6,555,235 B1 | 4/2003 | Aufderheide et al. |
| 6,556,189 B1 | 4/2003 | Takahata et al. |
| 6,569,108 B2 | 5/2003 | Sarvazyan et al. |
| 6,610,936 B2 | 8/2003 | Gillespie et al. |
| 6,620,115 B2 | 9/2003 | Sarvazyan et al. |
| 6,629,343 B1 | 10/2003 | Chesney et al. |
| 6,668,230 B2 | 12/2003 | Mansky et al. |
| 6,720,712 B2 | 4/2004 | Scott et al. |
| 6,788,297 B2 | 9/2004 | Itoh et al. |
| 6,801,191 B2 | 10/2004 | Mukai et al. |
| 6,809,280 B2 | 10/2004 | Divigalpitiya et al. |
| 6,812,621 B2 | 11/2004 | Scott |
| 6,822,640 B2 | 11/2004 | Derocher |
| 6,879,318 B1 | 4/2005 | Chan et al. |
| 6,888,537 B2 | 5/2005 | Benson et al. |
| 6,931,938 B2 | 8/2005 | Knirck et al. |
| 6,995,752 B2 | 2/2006 | Lu |
| 7,138,984 B1 | 11/2006 | Miles |
| 7,173,607 B2 | 2/2007 | Matsumoto et al. |
| 7,190,350 B2 | 3/2007 | Roberts |
| 7,215,329 B2 | 5/2007 | Yoshikawa et al. |
| 7,218,313 B2 | 5/2007 | Marcus et al. |
| 7,224,257 B2 | 5/2007 | Morikawa |
| 7,245,293 B2 | 7/2007 | Hoshino et al. |
| 7,273,979 B2 | 9/2007 | Christensen |
| 7,280,097 B2 | 10/2007 | Chen et al. |
| 7,324,094 B2 | 1/2008 | Moilanen et al. |
| 7,324,095 B2 | 1/2008 | Sharma |
| 7,336,260 B2 | 2/2008 | Martin et al. |
| 7,337,085 B2 | 2/2008 | Soss |
| 7,345,680 B2 | 3/2008 | David |
| 7,406,661 B2 | 7/2008 | Väänänen et al. |
| 7,425,749 B2 | 9/2008 | Hartzell et al. |
| 7,426,873 B1 | 9/2008 | Kholwadwala et al. |
| 7,449,758 B2 | 11/2008 | Axelrod et al. |
| 7,460,109 B2 | 12/2008 | Safai et al. |
| 7,476,952 B2 | 1/2009 | Vaganov et al. |
| 7,508,040 B2 | 3/2009 | Nikkel et al. |
| 7,554,167 B2 | 6/2009 | Vaganov |
| 7,607,111 B2 | 10/2009 | Vaananen et al. |
| 7,620,521 B2 | 11/2009 | Breed et al. |
| 7,629,969 B2 | 12/2009 | Kent |
| 7,649,522 B2 | 1/2010 | Chen et al. |
| 7,663,612 B2 | 2/2010 | Bladt |
| 7,685,538 B2 | 3/2010 | Fleck et al. |
| 7,698,084 B2 | 4/2010 | Soss |
| 7,701,445 B2 | 4/2010 | Inokawa et al. |
| 7,746,327 B2 | 6/2010 | Miyakoshi |
| 7,791,151 B2 | 9/2010 | Vaganov et al. |
| 7,819,998 B2 | 10/2010 | David |
| 7,825,911 B2 | 11/2010 | Sano et al. |
| 7,903,090 B2 | 3/2011 | Soss et al. |
| 7,921,725 B2 | 4/2011 | Silverbrook et al. |
| 7,952,566 B2 | 5/2011 | Poupyrev et al. |
| 7,973,772 B2 | 7/2011 | Gettemy et al. |
| 7,973,778 B2 | 7/2011 | Chen |
| 8,004,052 B2 | 8/2011 | Vaganov |
| 8,004,501 B2 | 8/2011 | Harrison |
| 8,013,843 B2 | 9/2011 | Pryor |
| 8,026,906 B2 | 9/2011 | Mölne et al. |
| 8,044,929 B2 | 10/2011 | Baldo et al. |
| 8,068,100 B2 | 11/2011 | Pryor |
| 8,072,437 B2 | 12/2011 | Miller et al. |
| 8,072,440 B2 | 12/2011 | Pryor |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,154,528 B2 | 4/2012 | Chen et al. |
| 8,159,473 B2 | 4/2012 | Cheng et al. |
| 8,164,573 B2 | 4/2012 | DaCosta et al. |
| 8,183,077 B2 | 5/2012 | Vaganov et al. |
| 8,184,093 B2 | 5/2012 | Tsuiki |
| 8,188,985 B2 | 5/2012 | Hillis et al. |
| 8,199,116 B2 | 6/2012 | Jeon et al. |
| 8,212,790 B2 | 7/2012 | Rimas-Ribikauskas et al. |
| 8,237,537 B2 | 8/2012 | Kurtz et al. |
| 8,243,035 B2 | 8/2012 | Abe et al. |
| 8,253,699 B2 | 8/2012 | Son |
| 8,260,337 B2 | 9/2012 | Periyalwar et al. |
| 8,269,731 B2 | 9/2012 | Mölne |
| 8,289,288 B2 | 10/2012 | Whytock et al. |
| 8,289,290 B2 | 10/2012 | Klinghult |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | Tho et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |
| 8,387,464 B2 | 3/2013 | McNeil et al. |
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,451,245 B2 | 5/2013 | Heubel et al. |
| 8,456,440 B2 | 6/2013 | Abe et al. |
| 8,466,889 B2 | 6/2013 | Tong et al. |
| 8,477,115 B2 | 7/2013 | Rekimoto |
| 8,493,189 B2 | 7/2013 | Suzuki |
| 2003/0067448 A1 | 4/2003 | Park |
| 2003/0189552 A1 | 10/2003 | Chuang et al. |
| 2004/0012572 A1 | 1/2004 | Sowden et al. |
| 2004/0140966 A1 | 7/2004 | Marggraff et al. |
| 2006/0028441 A1 | 2/2006 | Armstrong |
| 2006/0244733 A1 | 11/2006 | Geaghan |
| 2006/0284856 A1 | 12/2006 | Soss |
| 2007/0035525 A1 | 2/2007 | Yeh et al. |
| 2007/0046649 A1 | 3/2007 | Reiner |
| 2007/0070046 A1 | 3/2007 | Sheynblat et al. |
| 2007/0070053 A1 | 3/2007 | Lapstun et al. |
| 2007/0097095 A1 | 5/2007 | Kim et al. |
| 2007/0103449 A1* | 5/2007 | Laitinen ............... G06F 3/016 345/173 |
| 2007/0103452 A1 | 5/2007 | Wakai et al. |
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0262965 A1 | 11/2007 | Hirai et al. |

(56) References Cited

U.S. PATENT DOCUMENTS

| | | |
|---|---|---|
| 2007/0277616 A1 | 12/2007 | Nikkel et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0088600 A1 | 4/2008 | Prest et al. |
| 2008/0094367 A1 | 4/2008 | Van De Ven et al. |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1* | 12/2010 | Meade ............... G11C 13/0004 365/163 |
| 2010/0315373 A1 | 12/2010 | Steinhauser et al. |
| 2010/0321310 A1 | 12/2010 | Kim et al. |
| 2010/0321319 A1 | 12/2010 | Hefti et al. |
| 2010/0323467 A1* | 12/2010 | Vaganov et al. ............... 438/53 |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christoffersen |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Mäenpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0319987 A1 | 12/2012 | Woo |
| 2012/0327025 A1 | 12/2012 | Huska et al. |
| 2013/0038541 A1 | 2/2013 | Bakker |

(56) References Cited

U.S. PATENT DOCUMENTS

| | | |
|---|---|---|
| 2013/0093685 A1 | 4/2013 | Kalu et al. |
| 2014/0007705 A1 | 1/2014 | Campbell et al. |
| 2014/0028575 A1 | 1/2014 | Parivar et al. |
| 2014/0055407 A1 | 2/2014 | Lee et al. |

FOREIGN PATENT DOCUMENTS

| | | |
|---|---|---|
| WO | 2004113859 | 12/2004 |
| WO | 2007/139695 | 12/2007 |

OTHER PUBLICATIONS

International Preliminary Report on Patentability dated Dec. 31, 2014 in corresponding International Application No. PCT/US2013/047090.

Mei et al., "Design and fabrication of an integrated three-dimensional tactile sensor for space robotic applications," Micro Electro Mechanical Systems, 1999. MEMS '99 Twelfth IEEE International Conference in Orlando, FL, USA, pp. 112-117 (1999).

* cited by examiner

RUGGEDIZED MEMS FORCE DIE

CROSS-REFERENCE TO RELATED APPLICATION

This application claims the benefit of U.S. Provisional Patent Application No. 61/690,161, filed on Jun. 21, 2012, entitled "RUGEDIZED MEMS FORCE DIE," the disclosure of which is expressly incorporated herein by reference in its entirety.

FIELD

The present disclosure describes piezoresistive force sensing dies that are used for converting force into strain, which is sensed by strain gages.

BACKGROUND

Current OEM force sensors, joysticks, touch-controls, etc generally employ older low performance technologies. The purpose of the present disclosure is to provide MEMS force dies, which are compact, mass producible and cost effective for OEM force sensors, joysticks, etc.

SUMMARY

Described herein are ruggedized wafer level MEMS force dies composed of a platform and a silicon sensor. The silicon sensor employs multiple flexible sensing elements containing Piezoresistive strain gages and wire bonds.

The platform protects the die and is employed to link the force to the flexible sensing elements. Apertures in the platform provide access for wire bonding and protect the wire bonds from the applied force.

The platform is joined to the sensing element at the outer periphery. An interior gap, which is formed by sculpturing the silicon sensor and/or the platform, allows the sensing element to deflect. It can be designed to limit the deflection in order to provide overload protection.

Bonding the thick platform to the outer periphery of the thin flexible sensing elements ruggedizes the die and prevents damage during dicing.

The force applied to the platform is linked to the flexible sensing elements. The gap allows the flexible sensing elements to bend and to stress the piezoresistive strain gages, which provide an output signal proportional to the applied force.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. While implementations will be described for with respect to a ruggedized MEMS force die, it will become evident to those skilled in the art that the implementations are not limited thereto.

Figure 1:
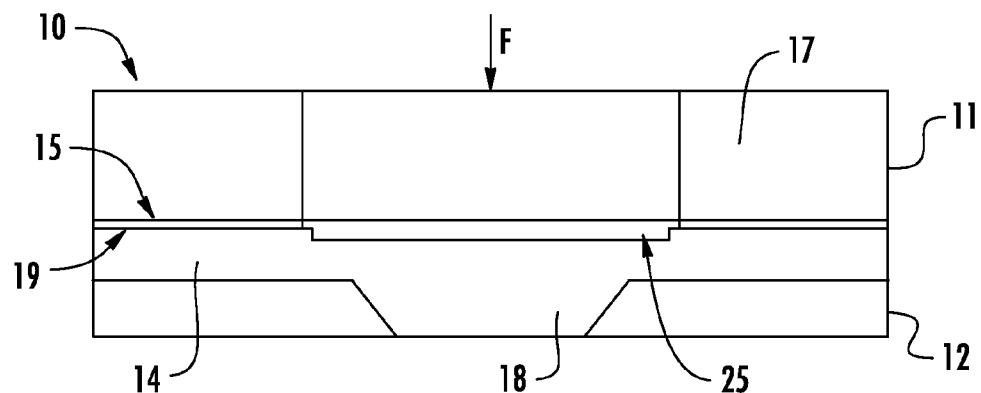
FIG. 1 shows a top view of the force die.

Referring to FIG. 1 the side view of the sensing die 10 is shown. The die is comprised of Pyrex platform 11 and silicon sensor 12. The bottom side of silicon sensor 12 is etched to predetermined depth to form four flexible sensing elements 14 supported by a cross-shaped structure 18. The top side of silicon sensor 12 is etched to a predetermined depth to form gap 25. Platform 11, has four apertures 17, is attached to flexible sensing elements 14 by anodic bonding 19. The geometry of gap 25 in combination of apertures 17, form four linking areas 15 at the corners of the die.

Figure 2:
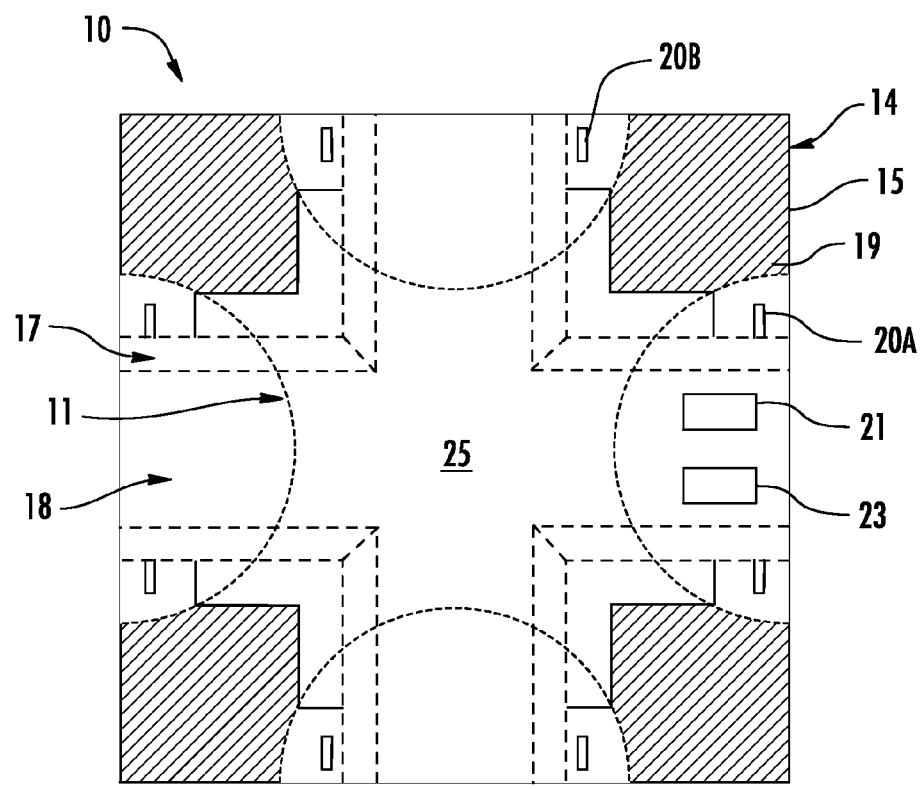
FIG. 2 shows a side view of the force die.

Referring to FIG. 2 the top view of the sensing die 10 is shown. Piezoresistive strain gages 20A and 20B are diffused or deposited on flexible sensing elements 14. Wire bonding pads 21 are placed on structure 18. Apertures 17 of platform 11 provide access to the wire bonding pads. The thick platform 11 prevents damage to the flexible sensing elements and shields the wire bonds 23 from the force applied to platform 11. Force "F" is linked via outer edges (e.g., linking areas 15) to flexible sensing elements 14. Gap 25 allows the force to bend the flexible sensing elements 14 and to stress strain gages 20 A & B, which provide an output signal proportional to the applied force.

Figure 3:
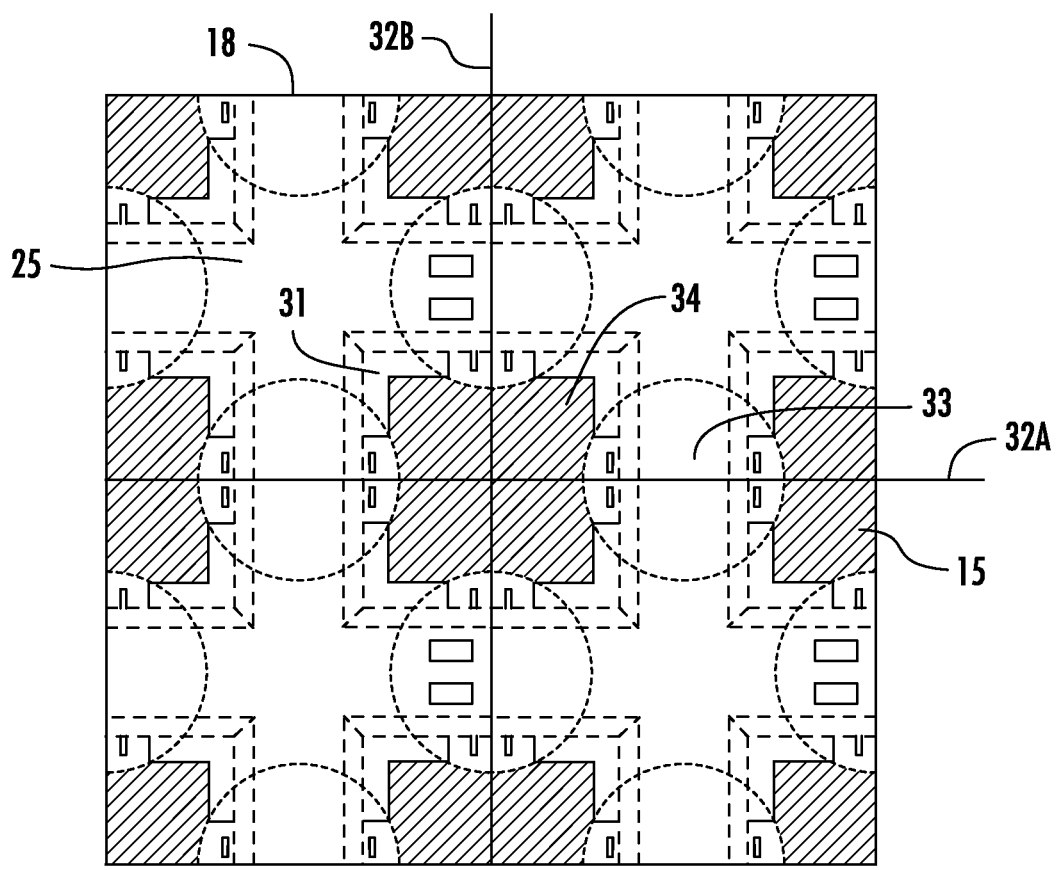
FIG. 3 shows a top view of a section of composite silicon and Pyrex wafer.

Referring to FIG. 3 the top view of a section of composite silicon and Pyrex wafer is shown. The bottom side of the silicon wafer is etched to predetermined depth to form diaphragms 31. The top side of the silicon wafer is etched to predetermined depth to form gaps 25. The Pyrex wafer has round holes 33. The Pyrex wafer and the silicon wafer are anodic bonded, which produces bonded areas 34 comprised of thin silicon ruggedized by being bonded to thick Pyrex. When the wafer is diced along lines 32A&B, the saw cuts through ruggedized areas. Furthermore, since areas 34 are sawed into four linking areas 15, no bending or torsion moments can be produced in the dies by the saw. The dies are completely protected from being damaged during the dicing.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:
1. A MEMS force die, comprising:
a protective platform for receiving an applied force; and
a force sensor having a center and an outer edge, wherein the force sensor is bonded to the protective platform at a plurality of peripheral points along at least a portion of the outer edge, the force sensor comprising a plurality of flexible sensing elements having one or more piezoresistive strain gauges formed on an upper surface of the flexible sensing elements, each of the flexible sensing elements having a thickness less than a thickness at the center of the force sensor, the flexible sensing elements being configured to deflect in response to the applied force received by the protective platform and transferred to the force sensor, and the one or more piezoresistive strain gauges providing an output signal proportional to the applied force, wherein the force sensor defines a gap at the center thereof, the gap being arranged between the protective platform and the force sensor, and a depth of the gap being configured to limit an amount of deflection of the flexible sensing elements, wherein the protective platform is above the flexible sensing elements in a thickness direction, and wherein the plurality of peripheral points are arranged over the flexible sensing elements.

2. The MEMS force die of claim 1, wherein the force sensor defines an upper side and a bottom side, the upper side of the force sensor being etched to form the gap.

3. The MEMS force die of claim 2, wherein the force sensor further defines a linking area on the upper side of the force sensor, the applied force being transferred to the flexible sensing elements via the linking area.

4. The MEMS force die of claim 1, wherein the force sensor further comprises a cross-shaped structure supporting the flexible sensing elements, and at least one of the flexible sensing elements has the one or more piezoresistive strain gauges formed thereon.

5. The MEMS force die of claim 4, wherein the force sensor defines an upper side and a bottom side, the bottom side of the force sensor being etched to form the cross-shaped structure and the flexible sensing elements.

6. The MEMS force die of claim 4, wherein the force sensor further comprises at least one wire bonding pad, the at least one wire bonding pad being arranged on the cross-shaped structure.

7. The MEMS force die of claim 6, wherein the protective platform has one or more apertures for providing access to the at least one wire bonding pad.

8. The MEMS force die of claim 6, wherein the protective platform is configured to prevent damage to the flexible sensing elements and shield the at least one wire bonding pad from the applied force.

9. The MEMS force die of claim 1, wherein the force sensor is bonded to the protective platform through an anodic bond.

10. The MEMS force die of claim 1, wherein the one or more piezoresistive strain gauges are diffused or deposited on the plurality of flexible sensing elements.

11. The MEMS force die of claim 1, wherein the force sensor is a silicon sensor.

12. A method for manufacturing a MEMS force die, comprising:

etching an upper side of a sensor wafer to form a gap and at least one linking area;

etching a bottom side of the sensor wafer to form at least one diaphragm;

forming one or more piezoresistive strain gauges on the diaphragm;

bonding the at least one linking area of the sensor wafer to a protective platform wafer to form bonded areas at a plurality of peripheral points, wherein the gap is arranged between the bonded sensor wafer and protective platform wafer; and dicing the bonded sensor wafer and protective platform wafer along one or more lines intersecting the bonded areas to form a plurality of flexible sensing elements from the diaphragm, the flexible sensing elements being configured to deflect in response to an applied force received by the diced protective platform wafer and transferred to the diced sensor wafer, and the one or more piezoresistive strain gauges providing an output signal proportional to the applied force, wherein a depth of the gap is configured to limit an amount of deflection of the flexible sensing elements, wherein the gap is at a center of the diced sensor wafer and the plurality of peripheral points are along at least a portion of an outer edge of the diced sensor wafer, wherein each of the flexible sensing elements has a thickness less than a thickness at the center of the diced sensor wafer, wherein the diced protective platform wafer is above the flexible sensing elements in a thickness direction, wherein the one or more piezoresistive strain gauges are arranged on an upper surface of the flexible sensing elements, and wherein the plurality of peripheral points are arranged over the flexible sensing elements.

13. The method of claim 12, further comprising forming at least one wire bonding pad on the sensor wafer.

14. The method of claim 13, wherein the protective platform wafer has one or more apertures for providing access to the at least one wire bonding pad.

15. The method of claim 14, wherein the diced protective platform wafer is configured to prevent damage to the flexible sensing elements and shield the at least one wire bonding pad from the applied force.

16. The method of claim 12, wherein the at least one linking area of the sensor wafer is bonded to the protective platform wafer through an anodic bond.

17. The method of claim 12, wherein the one or more piezoresistive strain gauges are formed on the diaphragm by diffusion or deposition.

18. The method of claim 12, wherein the sensor wafer is a silicon wafer.

* * * * *